US008969893B2

(12) United States Patent
Kim

(10) Patent No.: US 8,969,893 B2
(45) Date of Patent: Mar. 3, 2015

(54) LIGHT EMITTING DEVICE, LIGHT EMITTING DEVICE PACKAGE, AND LIGHTING SYSTEM

(75) Inventor: Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 213 days.

(21) Appl. No.: 13/033,795

(22) Filed: Feb. 24, 2011

(65) Prior Publication Data
US 2011/0266518 A1 Nov. 3, 2011

(30) Foreign Application Priority Data

Apr. 28, 2010 (KR) .................. 10-2010-0039594

(51) Int. Cl.
H01L 33/20 (2010.01)
H01L 33/50 (2010.01)

(52) U.S. Cl.
CPC ............... *H01L 33/20* (2013.01); *H01L 33/50* (2013.01); *Y10S 362/80* (2013.01)
USPC ........ 257/98; 257/79; 257/100; 257/E33.001; 362/800

(58) Field of Classification Search
USPC ................ 257/98, 79, 95, 100, E33.001; 362/311.02, 800
See application file for complete search history.

(56) References Cited

U.S. PATENT DOCUMENTS

| 6,791,117 | B2 * | 9/2004 | Yoshitake et al. ............ 257/94 |
| 1,064,356 | A1 | 4/2006 | Khanarian et al. |
| 7,277,143 | B2 * | 10/2007 | Funahata et al. ............ 349/114 |
| 1,194,365 | A1 | 9/2009 | David et al. |
| 7,700,965 | B2 | 4/2010 | Chang |
| 7,759,670 | B2 * | 7/2010 | Liu et al. ........................ 257/13 |
| 8,003,994 | B2 | 8/2011 | Liu et al. |
| 1,071,840 | A1 | 1/2012 | Cho et al. |
| 8,120,726 | B2 * | 2/2012 | Suzuki et al. ................. 349/61 |
| 8,138,513 | B2 * | 3/2012 | Won et al. ..................... 257/98 |
| 8,184,236 | B2 * | 5/2012 | Aritake et al. ................ 349/65 |
| 8,242,690 | B2 * | 8/2012 | Shen ............................. 313/506 |
| 8,303,154 | B2 * | 11/2012 | Ha et al. ...................... 362/619 |
| 8,376,601 | B2 * | 2/2013 | Yashiro ........................ 362/606 |
| 8,455,886 | B2 * | 6/2013 | Joichi et al. ................... 257/84 |
| 8,575,641 | B2 * | 11/2013 | Zimmerman et al. ......... 257/98 |
| 2006/0192217 | A1 | 8/2006 | David et al. |
| 2007/0001182 | A1 | 1/2007 | Schardt et al. |

(Continued)

FOREIGN PATENT DOCUMENTS

CN 10-1064356 10/2007
CN 10-1071840 11/2007

(Continued)

*Primary Examiner* — Michael Shingleton
(74) *Attorney, Agent, or Firm* — McKenna Long & Aldridge LLP

(57) ABSTRACT

Provided are a light emitting device, a light emitting device package, and a lighting system. The light emitting device includes a light emitting structure, a non-periodic light extraction pattern, and a phosphor layer. The light emitting structure includes a first conductive type semiconductor layer, a second conductive type semiconductor layer over the first conductive type semiconductor layer, and an active layer between the first conductive type semiconductor layer and the second conductive type semiconductor layer. The non-periodic light extraction pattern is disposed over the light emitting structure. The phosphor layer is disposed over the non-periodic light extraction pattern. The phosphor layer fills at least one portion of the non-periodic light extraction pattern.

20 Claims, 7 Drawing Sheets

(56) References Cited

U.S. PATENT DOCUMENTS

| | | |
|---|---|---|
| 2008/0251781 A1 | 10/2008 | Han et al. |
| 2009/0278149 A1 | 11/2009 | Chang |
| 2009/0278233 A1* | 11/2009 | Pinnington et al. ........... 257/615 |
| 2010/0246210 A1* | 9/2010 | Yashiro .......................... 362/606 |

FOREIGN PATENT DOCUMENTS

| | | |
|---|---|---|
| CN | 10-1194365 | 6/2008 |
| CN | 101577298 A | 11/2009 |
| CN | 10-1673801 | 3/2010 |
| DE | 10 2007 003 785 A1 | 7/2008 |
| DE | 10 2008 022 542 A1 | 11/2009 |
| EP | 1 855 327 A2 | 11/2007 |
| EP | 1 879 238 A1 | 1/2008 |
| KR | 10-2007-0114924 A | 12/2007 |
| KR | 10-2008-0000884 A | 1/2008 |
| KR | 10-2009-0050592 A | 5/2009 |
| KR | 10-2009-0106946 A | 10/2009 |
| TW | 200919783 A | 5/2009 |
| WO | 2006/093653 A2 | 9/2006 |
| WO | WO 2008/086855 A1 | 7/2008 |

* cited by examiner

LIGHT EMITTING DEVICE, LIGHT EMITTING DEVICE PACKAGE, AND LIGHTING SYSTEM

CROSS-REFERENCE TO RELATED APPLICATIONS

The present application claims priority under 35 U.S.C. §119(a) of Korean Patent Application No. 10-2010-0039594 filed on Apr. 28, 2010, which is hereby incorporated by reference in its entirety as if fully set forth herein.

BACKGROUND

Embodiments relate to a light emitting device, a light emitting device package, and a lighting system.

In light emitting devices, P-N junction diodes having the properties of converting electrical energy into light energy may be formed by combining group III and V elements on the periodic table. Light emitting devices may implement various colors by controlling the composition ratio of compound semiconductors.

In light emitting devices, when a forward voltage is applied, an electron of an n-layer is combined with a hole of a p-layer to emit energy corresponding to an energy gap between the conduction band and the valance band. The energy is generally emitted in the form of heat or light. In light emitting devices, the energy is emitted in the form of light.

Nitride semiconductors, for example, are attracting much attention for the fields of optical devices and high-power electronic devices because of their high thermal stability and wide band gap energy. In particular, blue light emitting devices, green light emitting devices, and UV light emitting devices that use nitride semiconductors have been commercialized and are widely used.

For example, to form a white light emitting device package, light emitting devices of red, green and blue, which are the three primary colors of light, may be combined, or a yellow phosphor such as yttrium aluminum garnet (YAG) and terbium aluminum garnet (TAG) may be added to a blue light emitting device, or a (red/green/blue) three-colored phosphor may be used in a UV light emitting device.

However, in a related art white light emitting device package including a phosphor, the phosphor may be unevenly distributed around a chip of a light emitting device, and thus, a wide color temperature distribution may be formed.

In addition, since a distribution area of a phosphor is greater than the area of a light emitting device, the phosphor may be unevenly distributed around a chip of the light emitting device, and thus, a wide color temperature distribution may be also formed.

SUMMARY

Embodiments provide a light emitting device, a light emitting device package, and a lighting system, which can maintain light extraction efficiency and reduce a color temperature deviation according to a radiation angle.

In one embodiment, a light emitting device includes: a light emitting structure including a first conductive type semiconductor layer, a second conductive type semiconductor layer over the first conductive type semiconductor layer, and an active layer between the first conductive type semiconductor layer and the second conductive type semiconductor layer; a non-periodic light extraction pattern over the light emitting structure; and a phosphor layer over the non-periodic light extraction pattern, wherein the phosphor layer fills at least one portion of the non-periodic light extraction pattern.

In another embodiment, a light emitting device includes: a light emitting structure including a first conductive type semiconductor layer, a second conductive type semiconductor layer over the first conductive type semiconductor layer, and an active layer between the first conductive type semiconductor layer and the second conductive type semiconductor layer; a non-periodic light extraction pattern over the light emitting structure; and a phosphor layer over the non-periodic light extraction pattern, wherein the phosphor layer has a first surface facing the light emitting structure and a second surface facing an opposite side of the first surface, and the first surface of the phosphor layer includes a pattern corresponding to the non-periodic light extraction pattern disposed on the light emitting structure.

In further another embodiment, a light emitting device package includes: a package body; the light emitting device of any one of claims 1 to 9 over the package body; and an electrode electrically connecting the package body to the light emitting device.

In still further another embodiment, a lighting system includes a light emitting module that includes a substrate and the light emitting device package of claim 17 over the substrate.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting device, a light emitting device package, and a lighting system according to embodiments will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

EMBODIMENTS

Figure 1:
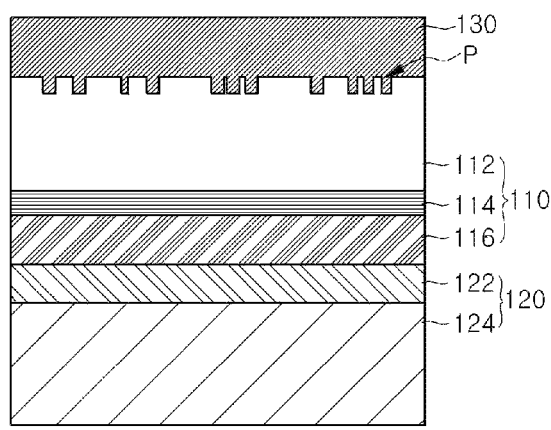
FIG. 1 is a cross-sectional view illustrating a light emitting device according to an embodiment.
Figure 2:
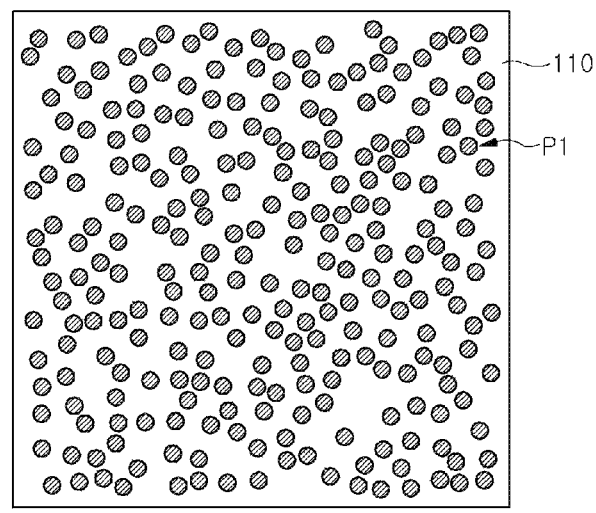
FIGS. 2 and 3 are plan views illustrating light emitting devices according to embodiments.
Figure 3:
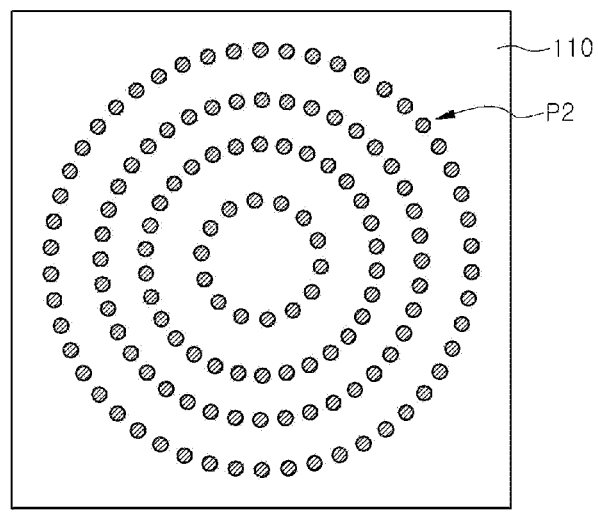

FIG. 1 is a cross-sectional view illustrating a light emitting device 100 according to an embodiment, and FIGS. 2 and 3 are plan views illustrating light emitting devices according to embodiments.

A pseudorandom pattern P1 is exemplified as a non-periodic light extraction pattern P in FIG. 2, and a circular pattern P1 is exemplified as the non-periodic light extraction pattern P in FIG. 3.

The non-periodic light extraction pattern P may include a light extraction pattern having no translational symmetry.

The light emitting device 100 may include: a light emitting structure 110 including a first conductive type semiconductor layer 112, an active layer 114, and a second conductive type semiconductor layer 116; the non-periodic light extraction pattern P disposed on the light emitting structure 110; and a phosphor layer 130 disposed on the non-periodic light extraction pattern P.

The phosphor layer 130 may fill at least one portion of the non-periodic light extraction pattern P.

The non-periodic light extraction pattern P may include the pseudorandom pattern P1 as illustrated in FIG. 2, but the present disclosure is not limited thereto.

The non-periodic light extraction pattern P may include a concave-convex structure with a random shape or a rough surface as well as a predetermined shape, and thus, the present disclosure is not limited thereto.

The pseudorandom pattern P1 may include hole patterns or column patterns randomly disposed within a limited space.

The pseudorandom pattern P1 may have a nearest mean distance ranging from about 200 nm to about 3000 nm.

The non-periodic light extraction pattern P may include the circular pattern P2 as illustrated in FIG. 3.

The circular pattern P2 may include hole patterns or column patterns on the circumferences of concentric circles.

The phosphor layer 130 may have a uniform thickness.

A white light emitting diode (LED) is formed by combining parent light sources, for example, a blue LED and a phosphor. In this case, it is necessary to reduce a color temperature deviation according to a radiation angle. To this end, a (conformal coating) method of forming a phosphor thin layer having a uniform thickness on an upper layer of a light emitting structure may be used, and thus, a phosphor is formed as a light source having the same position and same area as those of a blue LED to reduce a color temperature deviation in a package according to a light path, except for chromatic aberration.

Accordingly, since a traveling path of long wavelength light converted in the phosphor is substantially the same as that of blue light that is not absorbed to the phosphor, a color temperature deviation according to a path can be ignored.

Figure 4:
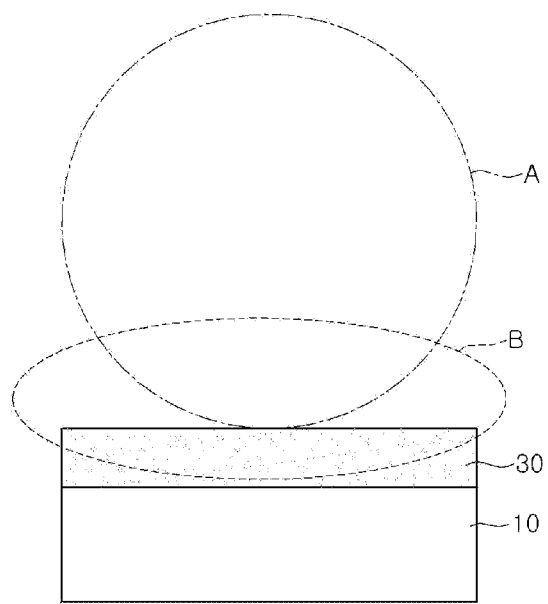
FIG. 4 is a schematic view illustrating a light emitting pattern of a light emitting device in the related art.

FIG. 4 is a schematic view illustrating a light emitting pattern of a light emitting device in the related art.

Although a coating (conformal coating) process for a phosphor layer having a uniform thickness is used, a color temperature deviation according to a radiation angle as illustrated in FIG. 4 may still be present.

This is because a radial distribution A of the blue light is basically different from a radial distribution B of light converted by the phosphor.

That is, the radial distribution A of the blue light is determined by an interface between GaN and a background material (air or Si gel) and a light extraction structure, and is slightly concentrated in a vertical direction.

On the contrary, since the long wavelength light converted by the phosphor is generated through a spontaneous emission process, the long wavelength light has the same probability about the radial distribution B. Thus, when the white LED is formed by combining the blue light and the long wavelength light, as a radiation angle closes to the vertical direction, the intensity of the blue light increases, thereby exhibiting a relatively high color temperature.

Specifically, since a vertical GaN-based LED has a radial distribution that is more concentrated in the vertical direction than a side type structure, it is necessary to design and develop a light emitting device having a similar radial distribution to that of light from a phosphor.

Figure 5:
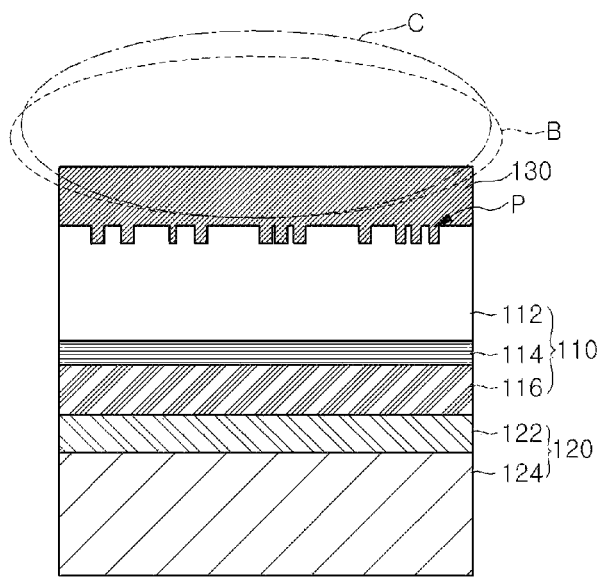
FIG. 5 is a schematic view illustrating a light emitting pattern of a light emitting device according to an embodiment.

FIG. 5 is a schematic view illustrating a light emitting pattern of a light emitting device according to an embodiment.

In the current embodiment, the non-periodic light extraction pattern P may be disposed in an n type semiconductor layer or an undoped semiconductor layer of a vertical GaN-based LED to reduce a color temperature deviation of a white LED according to a radiation angle. The undoped semiconductor layer is a layer that is not doped with n type or p type ions.

For example, the non-periodic light extraction pattern P may include the pseudorandom pattern P1 or the circular pattern P2.

Figure 6:
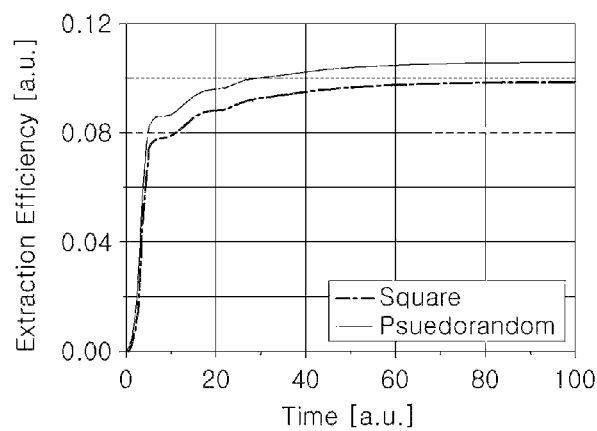
FIG. 6 is a graph illustrating light extraction efficiency of a light emitting device according to an embodiment.

FIG. 6 is a graph illustrating light extraction efficiency of a light emitting device according to an embodiment.

The non-periodic light extraction pattern P has the same extraction efficiency as that of a related art light extraction pattern (square lattice pattern) having periodicity, and spreads light in the horizontal direction, not a vertical direction.

Light is concentrated vertically by a light extraction pattern because of diffraction due to periodicity of a pattern lattice. Thus, the pseudorandom pattern P1 having no periodicity or the circular pattern P2 has a similar light emitting distribution to that of a flat surface. Thus, a phosphor layer having a uniform thickness (through conformal coating) is formed on a light emitting structure including the pseudorandom pattern P1 or the circular pattern P2, so as to reduce a color temperature deviation.

In the light emitting device according to the embodiment, the phosphor layer having a uniform thickness is formed on the non-periodic light extraction pattern, thereby maintaining the light extraction efficiency and reducing a color temperature deviation according to a radiation angle.

Hereinafter, a method of manufacturing a light emitting device according to an embodiment will be described with reference to FIGS. 7 to 9.

Figure 7:
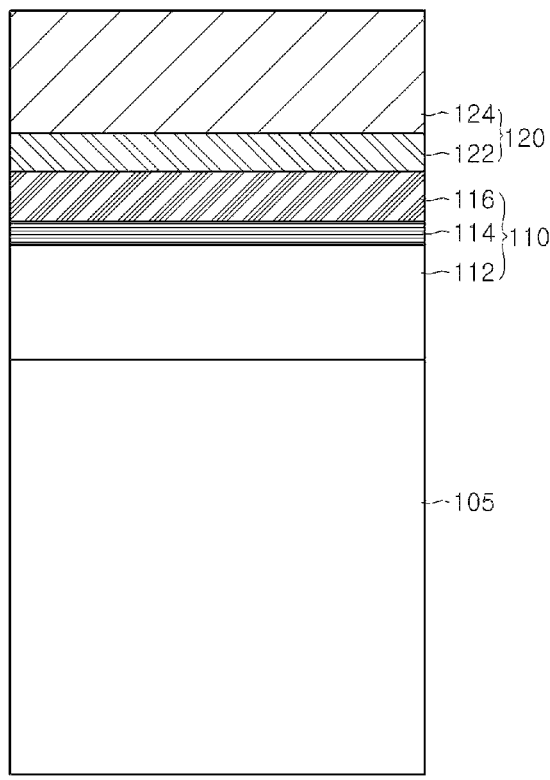
FIGS. 7 to 9 are cross-sectional views illustrating a method of manufacturing a light emitting device according to an embodiment.
Figure 8:
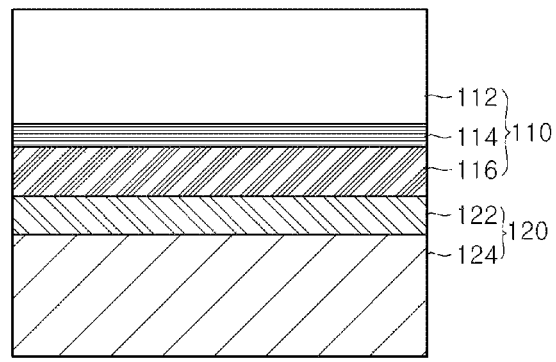

First, a first substrate 105 is prepared as illustrated in FIG. 7. The first substrate 105 includes a conductive substrate or an insulating substrate. For example, the first substrate 105 may include at least one of sapphire ($Al_2O_3$), SiC, Si, GaAs, GaN, ZnO, Si, GaP, InP, Ge, and $Ga_2O_3$. A concave-convex structure may be disposed on the upper portion of the first substrate 105, but the present disclosure is not limited thereto.

A wet cleaning operation may be performed on the first substrate 105 to remove impurities from the surface of the first substrate 105.

After that, the light emitting structure 110 including the first conductive type semiconductor layer 112, the active layer 114, and the second conductive type semiconductor layer 116 may be formed on the first substrate 105.

The light emitting structure 110 may be formed using a method such as metal organic chemical vapor deposition (MOCVD), chemical vapor deposition (CVD), plasma-enhanced chemical vapor deposition (PECVD), molecular beam epitaxy (MBE), and hydride vapor phase epitaxy (HYPE), but the present disclosure is not limited thereto.

A buffer layer (not shown) may be formed on the first substrate 105. The buffer layer (not shown) can reduce a lattice mismatch between the material of the light emitting structure 110 and the first substrate 105, and may be formed of group III-V compound semiconductor, for example, be formed of at least one of GaN, InN, AlN, InGaN, AlGaN, InAlGaN, and AlInN. An undoped semiconductor layer may be formed on the buffer layer (not shown), but the present disclosure is not limited thereto.

The first conductive type semiconductor layer 112 may be formed of group III-V compound semiconductor doped with a first conductive type dopant. When the first conductive type semiconductor layer 112 is an N-type semiconductor layer, the first conductive type dopant may include Si, Ge, Sn, Se, or Te as a N-type dopant, but the present disclosure is not limited thereto.

The first conductive type semiconductor layer 112 may include a semiconductor material having a composition formula of $In_xAl_yGa_{1-x-y}N$ ($0 \le x \le 1$, $0 \le y \le 1$, $0 \le x+y \le 1$).

The first conductive type semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive type semiconductor layer 112 may be formed as an N-type GaN layer by using a method such as chemical vapor deposition (CVD), molecular beam epitaxy (MBE), sputtering, or hydride vapor phase epitaxy (HYPE). The first conductive type semiconductor layer 112 may be formed by injecting silane ($SiH_4$) gas and n-type impurities such as trimethyl gallium (TMGa) gas, ammonia ($NH_3$) gas, nitrogen ($N_2$) gas, and silicon (Si) into a chamber.

In the active layer 114, electrons injected through the first conductive type semiconductor layer 112 meet holes injected through the second conductive type semiconductor layer 116 to be formed later to emit light having energy determined by the natural energy band of the active layer 114 (light emitting layer).

The active layer 114 may have at least one of a single quantum well structure or a multi quantum well (MQW) structure, a quantum wire structure, and a quantum dot structure. For example, the active layer 114 may have a multi quantum well (MQW) structure that is formed by injecting trimethyl gallium (TMGa) gas, ammonia ($NH_3$) gas, nitrogen ($N_2$) gas, and trimethyl indium (TMIn) gas, but the present disclosure is not limited thereto.

Well layer/barrier layer of the active layer 114 may have a pair structure with at least one of InGaN/GaN, InGaN/InGaN, GaN/AlGaN, InAlGaN/GaN, GaAs(InGaAs)/AlGaAs, and GaP(InGaP)/AlGaP, but the present disclosure is not limited thereto. The well layer may be formed of a material having a lower band gap than that of the barrier layer.

A conductive type clad layer may be formed on at least one of the upper and lower sides of the active layer 114. The conductive type clad layer may be formed of AlGaN based semiconductor, and may have a higher band gap than that of the active layer 114.

The second conductive type semiconductor layer 116 may include group III-V compound semiconductor that is doped with a second conductive type dopant, e.g., include a semiconductor material having a composition formula of $In_xAl_yGa_{1-x-y}N$ ($0 \le x \le 1$, $0 \le y \le 1$, $0 \le x+y \le 1$). For example, the second conductive type semiconductor layer 116 may include a material selected from the group consisting of GaN, AN, AlGaN, InGaN, InN, InAlGaN, AlInN, AlGaAs, GaP, GaAs, GaAsP, and AlGaInP. When the second conductive type semiconductor layer 116 is a P type semiconductor layer, the second conductive type dopant may include Mg, Zn, Ca, Sr, or Ba as a P type dopant. The second conductive type semiconductor layer 116 may be formed as a single layer or a multi layer, but the present disclosure is not limited thereto.

The second conductive type semiconductor layer 116 may be formed as a p type GaN layer by injecting trimethyl gallium (TMGa) gas, ammonia ($NH_3$) gas, nitrogen ($N_2$) gas, and trimethyl indium (TMIn) gas, and bis-ethyl-cyclopentadienyl-magnesium ($EtCp_2Mg$){$Mg(C_2H_5C_5H_4)_2$} including p type impurities such as magnesium (Mg) into a chamber, but the present disclosure is not limited thereto.

In the embodiment, the first conductive type semiconductor layer 112 may be an N type semiconductor layer, and the second conductive type semiconductor layer 116 may be a P type semiconductor layer, but the present disclosure is not limited thereto. A layer of an opposite conductive type semiconductor to the second conductive type semiconductor, e.g., an N type semiconductor layer (not shown) may be formed on the second conductive type semiconductor layer 116. Accordingly, the light emitting structure 110 may have one of an N-P junction structure, a P-N junction structure, an N-P-N junction structure and a P-N-P junction structure.

Thereafter, a second electrode layer 120 is formed on the second conductive type semiconductor layer 116.

The second electrode layer 120 may include an ohmic layer (not shown), a reflective layer 122, a coupling layer (not shown), and a conductive support substrate 124.

For example, the second electrode layer 120 may include an ohmic layer (not shown) that may be in ohmic contact with the light emitting structure 110 to efficiently supply power thereto and may be formed by stacking a single metal or a metal alloy, and a metal oxide in multi layers.

For example, the ohmic layer (not shown) may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf, but the present disclosure is not limited thereto.

The second electrode layer 120 includes the reflective layer 122 to reflect light incident from the light emitting structure 110 to improve the light extraction efficiency.

For example, the reflective layer 122 may be formed of a metal or alloy including at least one of Ag, Ni, Al, Rh, Pd, Ir, Ru, Mg, Zn, Pt, Au and Hf. The reflective layer 122 may be formed in a multi layer including the metal or alloy and a light transmitting conductive material such as IZO, IZTO, IAZO, IGZO, IGTO, AZO, and ATO. For example, the reflective layer 122 may be formed in a stacked structure such as IZO/Ni, AZO/Ag, IZO/Ag/Ni, and AZO/Ag/Ni.

When the second electrode layer 120 includes a coupling layer, the reflective layer 122 may function as the coupling layer, or may include a barrier metal or a bonding metal. For example, the coupling layer (not shown) may include at least one of Ti, Au, Sn, Ni, Cr, Ga, In, Bi, Cu, Ag and Ta.

The second electrode layer 120 may include the conductive support substrate 124. The conductive support substrate 124 can support the light emitting structure 110 and can supply power to the light emitting structure 110. The conductive support substrate 124 may be formed of a metal, a metal alloy, or a conductive semiconductor material, which has high electric conductivity.

For example, the conductive support substrate 124 may include at least one of copper (Cu), copper alloy, gold (Au), nickel (Ni), molybdenum (Mo), copper-tungsten (Cu—W), and a carrier wafer (e.g., Si, Ge, GaAs, GaN, ZnO, SiGe, or SiC).

The thickness of the conductive support substrate 124 may be varied according to a design for the light emitting device. For example, the conductive support substrate 124 may have a thickness ranging from about 30 μm to about 500 μm.

Methods of forming the conductive support substrate 124 may include an electrochemical metal deposition method and a bonding method using a eutectic metal.

Thereafter, as illustrated in FIG. 5, the first substrate 105 is removed to expose the first conductive type semiconductor layer 112. The first substrate 105 may be removed using a laser lift off method or a chemical lift off method. In addition, the first substrate 105 may be removed using a physical grinding method.

Figure 9:
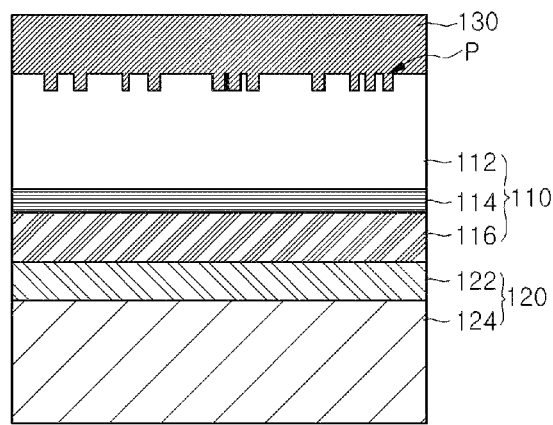

Next, referring to FIG. 9, the non-periodic light extraction pattern P is formed on the light emitting structure 110.

For example, the non-periodic light extraction pattern P is formed on the first conductive type semiconductor layer 112 or an undoped semiconductor layer (not shown), but the present disclosure is not limited thereto.

The non-periodic light extraction pattern P may include the pseudorandom pattern P1 as illustrated in FIG. 2, but the present disclosure is not limited thereto.

The non-periodic light extraction pattern P may include a light extraction pattern having no translational symmetry.

The pseudorandom pattern P1 may include hole patterns or column patterns randomly disposed within a limited space. The hole patterns or column patterns may have the same size, but the present disclosure is not limited thereto.

The hole patterns or column patterns may not overlap each other.

The pseudorandom pattern P1 may be formed through a wet or dry etch process using a predetermined mask pattern (not shown), but the present disclosure is not limited thereto.

The pseudorandom pattern P1 may have a nearest mean distance ranging from about 200 nm to about 3000 nm, considering the light extraction efficiency.

Here, the nearest mean distance of the pseudorandom pattern P1 is a mean value of distances between structures forming a pattern.

The non-periodic light extraction pattern P may include the circular pattern P2 as illustrated in FIG. 3.

The circular pattern P2 may include hole patterns or column patterns on the circumferences of concentric circles.

In the same manner as the pseudorandom pattern P1, the hole patterns or column patterns may not overlap each other, and the circular pattern P2 may have a nearest mean distance ranging from about 200 nm to about 3000 nm, but the present disclosure is not limited thereto.

According to the embodiment, the non-periodic light extraction pattern P includes a non-periodic pattern such as the pseudorandom pattern P1 or the circular pattern P2 to have the same extraction efficiency as that of the related art light extraction pattern (square lattice pattern) having periodicity, and to spread light in the horizontal direction, not the vertical direction.

That is, light is concentrated vertically by a light extraction pattern because of diffraction due to periodicity of a pattern lattice. Thus, the pseudorandom pattern P1 having no periodicity or the circular pattern P2 has a similar light emitting distribution to that of a flat surface. Thus, a phosphor layer having a uniform thickness (through conformal coating) is formed on a light emitting structure including the pseudorandom pattern P1 or the circular pattern P2, so as to reduce a color temperature deviation.

Next, the phosphor layer 130 is formed on the non-periodic light extraction pattern P. The phosphor layer 130 may have a uniform thickness.

The phosphor layer 130 may contact the non-periodic light extraction pattern P, but the present disclosure is not limited thereto, and thus, a passivation layer (not shown) may be disposed therebetween. The passivation layer may include a dielectric such as $SiO_2$ and $Si_3N_4$.

The phosphor layer 130 may be formed by adding a yellow phosphor (such as yttrium aluminum garnet (YAG) and terbium aluminum garnet (TAG)) to a blue LED, or by adding a (red/green/blue) three-colored phosphor to a UV LED, but the present disclosure is not limited thereto.

The phosphor may include a host material and an active material. For example, yttrium aluminum garnet (YAG) as a host material and a cerium (Ce) active material, or a silicate based host material and a europium (Eu) active material may be used, but the present disclosure is not limited thereto.

The phosphor layer 130 may have a flat upper surface, but the present disclosure is not limited thereto. Since the phosphor layer 130 having the flat upper surface is uniformly formed on the light emitting structure 110, the phosphor can be uniformly distributed around a chip of the light emitting device, and an optical design can be efficiently performed with a surface light emission.

In the embodiment, the phosphor layer 130 has a first surface facing the light emitting structure 110, and a second surface facing the opposite side of the first surface, and the first surface of the phosphor layer 130 may include a pattern corresponding to the non-periodic light extraction pattern P formed on the light emitting structure 110.

For example, the first surface facing the light emitting structure 110 may include a pattern protruding toward the light emitting structure 110, and the second surface may face the opposite side to the first surface and have a flat upper surface.

In the light emitting device and the method of manufacturing the light emitting device according to the embodiment, the phosphor layer having a uniform thickness is formed on the non-periodic light extraction pattern, thereby maintaining the light extraction efficiency and reducing a color temperature deviation according to a radiation angle.

Figure 10:
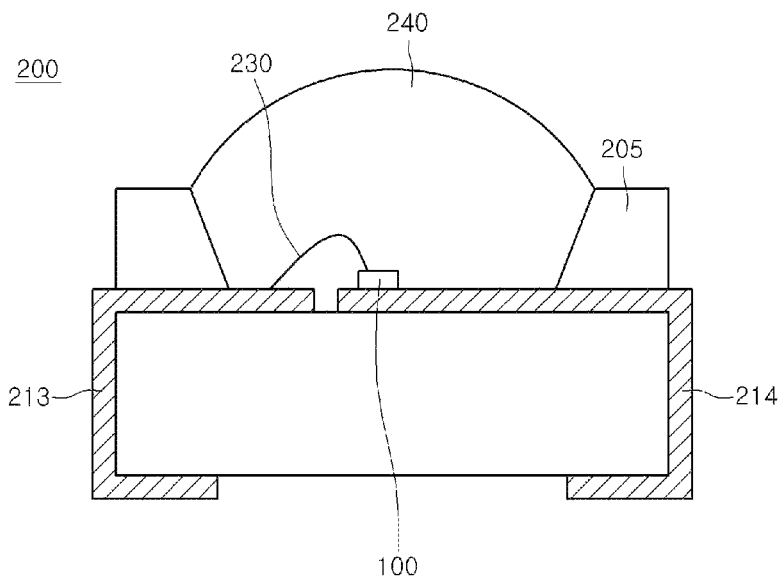
FIG. 10 is a cross-sectional view illustrating a light emitting device package according to an embodiment.

FIG. 10 is a cross-sectional view illustrating a light emitting device package provided with a light emitting device according to an embodiment.

Referring to FIG. 10, the light emitting device package according to the current embodiment includes a package body 205, a third electrode layer 213 and a fourth electrode layer 214 disposed in the package body 205, a light emitting device 100 disposed in the package body 205 and electrically connected to the third electrode layer 213 and the fourth electrode layer 214, and a molding member 240 surrounding the light emitting device 100.

The package body 205 may be formed of a silicon material, a synthetic resin material, or a metal material. An inclined surface may be disposed around the light emitting device 100.

The third electrode layer 213 and the fourth electrode layer 214 are electrically separated from each other and supply a power to the light emitting device 100. Also, the third electrode layer 213 and the fourth electrode layer 214 may reflect light generated in the light emitting device 100 to improve light efficiency, and may release heat generated in the light emitting device 100 to the outside.

The light emitting device 100 may be the vertical type light emitting device exemplified in FIG. 1, but the present disclosure is not limited thereto, and thus, the light emitting device 100 may be a horizontal type light emitting device.

The light emitting device 100 may be disposed on the package body 205 or on the third electrode layer 213 or the fourth electrode layer 214.

The light emitting device 100 may be electrically connected to the third electrode layer 213 and/or the fourth electrode layer 214 through one of a wire method, a flip chip method, and a die bonding method. In the embodiment, the light emitting device 100 is electrically connected to the third electrode layer 213 through the wire 230, and directly contacts the fourth electrode layer 214.

The molding member 240 may surround the light emitting device 100 to protect the light emitting device 100. The molding member 240 may include a phosphor to vary a wavelength of light emitted form the light emitting device 100.

The light emitting device package according to the embodiment may be provided in plurality on a substrate, and a light guide panel, a prism sheet, a spread sheet, and a fluorescent sheet may be disposed as an optical member in the path of light emitted from the light emitting device package. The light emitting device package, the substrate, and the optical member may function as a backlight unit or a lighting unit. For example, a lighting system may include a lighting unit, a backlight unit, an indicating device, a lamp, and a street lamp.

Figure 11:
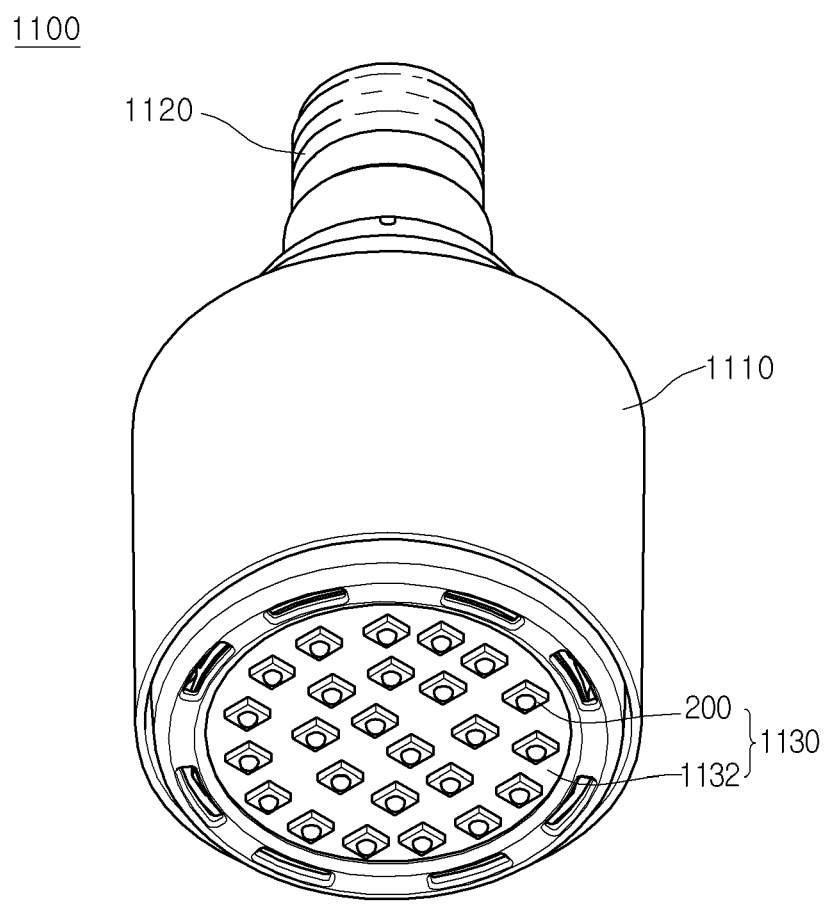
FIG. 11 is a perspective view illustrating a lighting unit according to an embodiment.

FIG. 11 is a perspective view of a lighting unit 1100 according to an embodiment. However, the lighting unit 1100 is just an example of a lighting system, and thus, the present disclosure is not limited thereto.

Referring to FIG. 11, the lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a substrate 1132 and at least one light emitting device package 200 mounted on the substrate 1132.

A circuit pattern may be printed on an insulation material to form the substrate 1132. For example, the substrate 1132 may include a printed circuit board (PCB), a metal core PCB, a flexible PCB, or a ceramic PCB.

Also, the substrate 1132 may be formed of a material that can effectively reflect light. A surface of the substrate 1132 may be coated with a colored material, e.g., a white or silver-colored material by which light is effectively reflected.

The light emitting device package 200 may be mounted on the substrate 1132. The light emitting device package 200 may include at least one light emitting device 100. The light emitting device 100 may include a colored light emitting diode that emits red, green, blue, or white light, and an UV light emitting diode that emits ultraviolet (UV) light.

The light emitting module 1130 may include a plurality of light emitting device packages 200 to obtain various colors and brightness. For example, a white light emitting device, a red light emitting device, and a green light emitting device may be disposed in combination with each other to secure a high color rendering index (CRI).

The connection terminal 1120 may be electrically connected to the light emitting module 1130 to supply a power. Although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power source using an interconnection.

Figure 12:
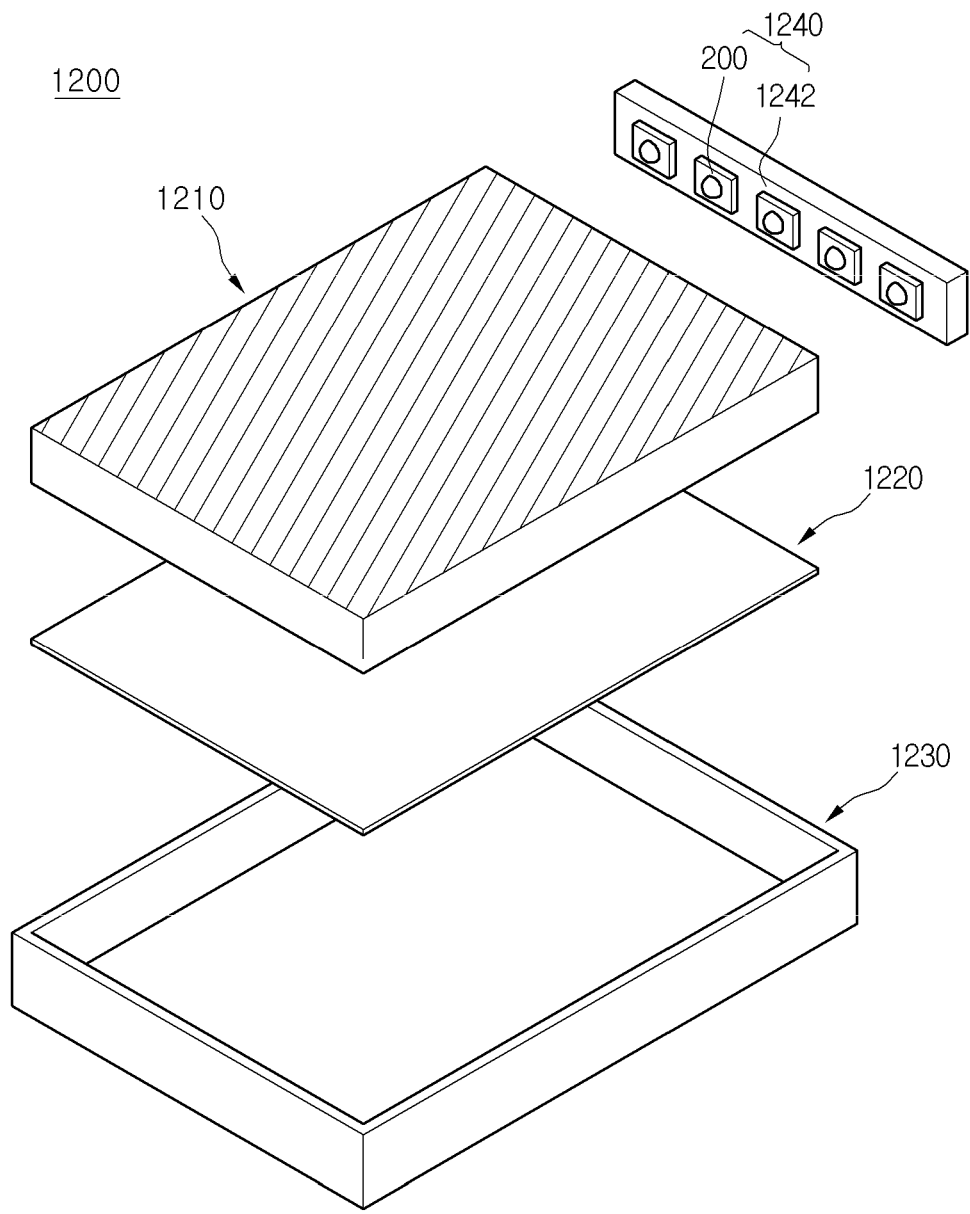
FIG. 12 is an exploded perspective view illustrating a backlight unit according to an embodiment.

FIG. 12 is an exploded perspective view of a backlight unit 1200 according to an embodiment. However, the backlight unit 1200 is just an example of a lighting system, and thus, the present disclosure is not limited thereto.

A backlight unit 1200 according to an embodiment may include a light guide plate 1210, a light emitting module 1240, a reflective member 1220, and a bottom cover 1230, but is not limited thereto. The light emitting module 1240 may provide light to the light guide plate 1210. The reflective member 1220 may be disposed below the light guide plate 1210. The bottom cover 1230 may receive the light guide plate 1210, the light emitting module 1240, and the reflective member 1220.

The light guide plate 1210 diffuses light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 provides light to at least one surface of the light guide plate 1210. Thus, the light emitting module 1240 may be used as a light source of a display device including the backlight unit.

The light emitting module 1240 may contact the light guide plate 1210, but is not limited thereto. In particular, the light emitting module 1240 may include a substrate 1242 and a plurality of light emitting device packages 200 mounted on the substrate 1242. The substrate 1242 may contact the light guide plate 1210, but is not limited thereto.

The substrate 1242 may be a PCB including a circuit pattern (not shown). However, the substrate 1242 may include a metal core PCB or a flexible PCB as well as the PCB, but is not limited thereto.

The light emitting device packages 200 may have light emitting surfaces that emit light on the substrate 1242 and are spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member may be formed of one of PET, PC, and PVC, but is not limited thereto.

The bottom cover 1230 may receive the light guide plate 1210, the light emitting module 1240, and the reflective member 1220. For this, the bottom cover 1230 may have a box shape with an open upper side, but is not limited thereto.

The bottom cover 1230 may be formed of a metal material or a resin material. Also, the bottom cover 1230 may be manufactured using a press forming process or an extrusion molding process.

As described above, the lighting system according to the embodiments includes the light emitting device package, thereby improving reliability.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure including a first conductive type semiconductor layer, a second conductive type semiconductor layer over the first conductive type semiconductor layer, and an active layer between the first conductive type semiconductor layer and the second conductive type semiconductor layer;
a light extraction pattern comprising a non-periodic pattern in the light emitting structure; and
a phosphor layer over the light extraction pattern,
wherein the phosphor layer comprises a first surface near the light emitting structure and a second surface facing an opposite side from the first surface, and the first surface includes a plurality of protrusion patterns corresponding to the light extraction pattern disposed in the light emitting structure,
wherein at least two protrusion patterns of the plurality of protrusion patterns have substantially different widths from each other, and
wherein the second surface is substantially flat and is farther from the light emitting structure than the first surface,
wherein the light extraction pattern is disposed in the first conductive type semiconductor layer,
wherein the light extraction pattern comprises a side surface substantially perpendicular to the second surface of the phosphor layer,
wherein the light extraction pattern comprises a bottom surface and a first and a second side surfaces substantially perpendicular,
wherein the bottom surface is parallel with an upper surface of the first conductive type semiconductor layer,
wherein the first side surface is parallel to the second side surface.

2. The light emitting device according to claim 1, wherein the light extraction pattern comprises a pseudorandom pattern.

3. The light emitting device according to claim 2, wherein the pseudorandom pattern comprises a hole or a column that is randomly disposed within a limited space.

4. The light emitting device according to claim 3, wherein the pseudorandom pattern has a nearest mean distance ranging from about 200 nm to about 3000 nm.

5. The light emitting device according to claim 1, wherein the light extraction pattern comprises only non-periodic circular patterns.

6. The light emitting device according to claim 5, wherein the non-periodic circular patterns comprise holes or columns on circumferences of concentric circles.

7. The light emitting device according to claim 1, wherein the light extraction pattern comprises a light extraction pattern having no translational symmetry.

8. A light emitting device comprising:
a light emitting structure including a first conductive type semiconductor layer, a second conductive type semiconductor layer over the first conductive type semiconductor layer, and an active layer between the first conductive type semiconductor layer and the second conductive type semiconductor layer;
a light extraction pattern comprising a non-periodic pattern in the light emitting structure; and
a phosphor layer over the light extraction pattern,
wherein the phosphor layer has a first surface facing the light emitting structure and a second surface facing an opposite side of the first surface, and the first surface of the phosphor layer includes a plurality of first protrusion patterns corresponding to the light extraction pattern disposed on the light emitting structure,
wherein the second surface is substantially flat,
wherein at least two protrusion patterns of the plurality of first protrusion patterns have substantially different widths from each other,
wherein the first conductive type semiconductor layer and the second conductive type semiconductor layer comprise at least one of an AlGaN layer and/or an InGaN layer, and
wherein the active layer comprises an InGaN well layer and a GaN barrier layer or an InGaN well layer and an InGaN barrier layer,
wherein the light extraction pattern is disposed in the first conductive type semiconductor layer,
wherein the light extraction pattern comprises a plurality of second protrusion patterns,
wherein a bottom width of one protrusion pattern of the plurality of second protrusion patterns is substantially the same as a top width of one protrusion pattern of the plurality of second protrusion patterns,
wherein the light extraction pattern comprises a bottom surface and a first and a second side surfaces substantially perpendicular,
wherein the bottom surface is parallel with an upper surface of the first conductive type semiconductor layer,
wherein the first side surface is parallel to the second side surface.

9. The light emitting device according to claim 8, wherein the light extraction pattern comprises a pseudorandom pattern.

10. The light emitting device according to claim 8, wherein the pseudorandom pattern comprises a hole or a column that is randomly disposed within a limited space.

11. The light emitting device according to claim 10, wherein the pseudorandom pattern has a nearest mean distance ranging from about 200 nm to about 3000 nm.

12. The light emitting device according to claim 8, wherein the light extraction pattern comprises only non-periodic circular patterns.

13. The light emitting device according to claim 12, wherein the non-periodic circular patterns comprise holes or columns on circumferences of concentric circles.

14. The light emitting device according to claim 8, wherein the light extraction pattern comprises a light extraction pattern having no translational symmetry.

15. The light emitting device according to claim 1, wherein an entire combined emitted light distribution from the phosphor layer is similar to an entire combined emitted light distribution from the light emitting structure.

16. The light emitting device according to claim 1, further comprising an electrode layer under the light emitting structure, wherein the electrode layer comprises a reflective layer, a conductive support substrate, and an adhesive layer disposed between the reflective layer and the conductive support substrate.

17. The light emitting device according to claim 16,
wherein the reflective layer includes at least one of Ag, Ni, Al, Pd, and Pt,
wherein the adhesive layer includes at least one of Ti, Au, Sn, Ni, Cr, and Cu, and
wherein the conductive support substrate includes a thickness ranging from about 30 μm to about 500 μm.

18. The light emitting device according to claim 16,
wherein the first conductive type semiconductor layer or a second conductive type semiconductor layer comprises an AlGaN layer,
wherein the active layer comprises an InGaN well layer and a GaN barrier layer or an InGaN well layer and an InGaN barrier layer.

19. The light emitting device according to claim 8, wherein the light extraction pattern is disposed in the first conductive type semiconductor layer, and
wherein the light extraction pattern comprises a side surface substantially perpendicular to the second surface of the phosphor layer.

20. A light emitting device comprising:
a light emitting structure including a first conductive type semiconductor layer, a second conductive type semiconductor layer over the first conductive type semiconductor layer, and an active layer between the first conductive type semiconductor layer and the second conductive type semiconductor layer;
a light extraction pattern comprising a non-periodic pattern in the light emitting structure; and
a phosphor layer over the light extraction pattern,
wherein the phosphor layer comprises a first surface near the light emitting structure and a second surface facing an opposite side from the first surface, and the first surface includes a first protrusion pattern, a second protrusion pattern, and a third protrusion pattern corresponding to the light extraction pattern disposed in the light emitting structure,
wherein the first protrusion pattern has substantially different widths from the second protrusion pattern and a first gap between the first protrusion pattern and the second protrusion pattern is different from a second gap between the second protrusion pattern and the third protrusion pattern,
wherein the second surface is substantially flat and is farther from the light emitting structure than the first surface,
wherein at least two of protrusion patterns have a top surface and bottom surface with a predetermined area,
wherein the light extraction pattern is disposed in the first conductive type semiconductor layer,
wherein the light extraction pattern comprises a bottom surface and a first and a second side surfaces substantially perpendicular,
wherein the bottom surface is parallel with an upper surface of the first conductive type semiconductor layer,
wherein the first side surface is parallel to the second side surface.

* * * * *